(12) United States Patent
Yamamoto et al.

(10) Patent No.: US 11,881,566 B2
(45) Date of Patent: Jan. 23, 2024

(54) BATTERY PACK MONITORING SYSTEM

(71) Applicant: DENSO CORPORATION, Kariya (JP)

(72) Inventors: Shunya Yamamoto, Kariya (JP); Ryotaro Miura, Kariya (JP); Yukihiro Tomonaga, Kariya (JP)

(73) Assignee: DENSO CORPORATION, Kariya (JP)

( * ) Notice: Subject to any disclaimer, the term of this patent is extended or adjusted under 35 U.S.C. 154(b) by 669 days.

(21) Appl. No.: 17/109,478

(22) Filed: Dec. 2, 2020

(65) Prior Publication Data

US 2021/0091425 A1    Mar. 25, 2021

Related U.S. Application Data

(63) Continuation of application No. PCT/JP2019/012161, filed on Mar. 22, 2019.

(30) Foreign Application Priority Data

Jun. 4, 2018 (JP) .................................. 2018-106879

(51) Int. Cl.
*H01M 10/48* (2006.01)
*G01R 31/3835* (2019.01)
*G01R 19/00* (2006.01)
*H01M 10/44* (2006.01)
*H02J 7/06* (2006.01)

(52) U.S. Cl.
CPC ...... *H01M 10/482* (2013.01); *G01R 19/0084* (2013.01); *G01R 31/3835* (2019.01); *H01M 10/441* (2013.01); *H01M 10/48* (2013.01); *H02J 7/06* (2013.01)

(58) Field of Classification Search
CPC .. H01M 10/482; H01M 10/441; H01M 10/48; H01M 50/204; H01M 50/298; H01M 2220/20; G01R 19/0084; G01R 31/3835; G01R 31/396; H02J 7/06; H02J 7/0016; H02J 7/0047; Y02E 60/10
See application file for complete search history.

(56) References Cited

U.S. PATENT DOCUMENTS 11,054,484 B2 *   7/2021   Tomonaga .......... H01M 10/482
2009/0208821 A1 *  8/2009   Kosugi ................. H02J 7/0047
                                                 429/93

(Continued)

*Primary Examiner* — Abdullah A Riyami
*Assistant Examiner* — Nader J Alhawamdeh
(74) *Attorney, Agent, or Firm* — POSZ LAW GROUP, PLC

(57) ABSTRACT

A battery pack monitoring system comprises first and second wirings connected to each battery cell, an RC filter formed of a resistor and a capacitor, and a discharging switch provided between two second wirings in a voltage monitoring device. The first and second wirings and the discharging switch are also connected to both ends of an inter-group group wire. In the second wiring of each battery cell, a discharging resistor is provided not to cause discharging of the charge in the capacitor. In the second wiring connected to a low voltage side for the inter-group wiring, a current limiting resistor having a higher resistance value than the discharging resistor is provided. A substitute discharging switch and a discharging resistor are provided so that the substitute discharging switch is turned on upon a voltage drop generated when current flows through the current limiting resistor.

9 Claims, 11 Drawing Sheets

(56) References Cited

U.S. PATENT DOCUMENTS

2016/0056655 A1* 2/2016 Kaneda ................ H02J 7/0016
                                                    320/136
2016/0291091 A1* 10/2016 Tsuchiya .............. G01R 31/396
2017/0205458 A1   7/2017 Kurooka et al.
2018/0267092 A1   9/2018 Kurooka et al.
2018/0284196 A1  10/2018 Tomonaga et al.

* cited by examiner

BATTERY PACK MONITORING SYSTEM

CROSS REFERENCE TO RELATED APPLICATIONS

The present application is a continuation application of International Patent Application No. PCT/JP2019/012161 filed on Mar. 22, 2019, which designated the U.S. and claims the benefit of priority of Japanese Patent Application No. 2018-106879 filed on Jun. 4, 2018. The entire disclosures of both applications are incorporated herein by reference.

FIELD

The present disclosure relates to a battery pack monitoring system that monitors a voltage of each battery cell forming a battery pack.

BACKGROUND

A voltage monitoring device is connected to a battery pack to detect a voltage of each battery cell of the battery pack and perform equalization processing or the like so that voltages of the battery cells are equalized. In case the voltage monitoring device is configured as an integrated circuit (IC), RC filters are provided between the battery pack and the voltage monitoring device for removing noise. In one battery pack monitoring system, a discharging resistor is provided to avoid discharging of a capacitor of the RC filter when discharging the battery cell for equalization processing.

A battery pack is generally formed of multiple cell groups, each of which is formed of multiple battery cells and connected is series via wires such as stack wires. The number of battery cells for each cell group is not fixed. In case the battery monitoring device is provided for such a battery pack of the different number of cell groups, it is not possible to predetermine positions in the two cell groups, which are to be connected via the wire. For this reason, it is necessary to prepare the wire for connecting the battery pack and the monitoring device, and a voltage detector and a discharging switch in the monitoring device. As a result, the voltage detector and the discharging switch provided inside the voltage monitoring device are connected even in a wiring part connecting the cell groups.

Further, in case that the battery pack is used as a power supply for driving an electric vehicle, for example, the battery monitoring device is likely to be affected by noise generated by a large current. In case that the power supply voltage for driving the vehicle is not boosted, a larger current flows and the noise affects more strongly. When a high voltage side terminal of the wire between the cell groups is affected by noise, the voltage of the high voltage side terminal may become lower than that at a low voltage side terminal because of a resistance of the wiring part. In case that a MOSFET is used as the discharging switch, a current flow path is formed to allow a current to flow in reverse from the low voltage side to the high voltage side through a parasitic diode of the MOSFET. This reverse current flows through the discharging resistor and generates a voltage drop.

In this case, the voltage of the high voltage side of the wiring part, that is, of the lowermost battery cell in the high voltage side cell group, becomes lower by the voltage drop of the wiring part, resulting in erroneous measurement of the battery cell voltage.

SUMMARY

According to the present disclosure, a battery pack monitoring system is provided for monitoring a battery pack including multiple cell groups, each of which is formed of multiple battery cells connected in series in multiple stages, and an inter-group wiring connecting a high voltage side cell group and a low voltage side cell group in the multiple cell groups. The battery pack monitoring system comprises a first wiring, a second wiring, an RC filter, a voltage monitoring device and a discharging switch. The first wiring is connected to a positive electrode of each battery cell. The second wiring is connected to a negative electrode of each battery cell. The RC filter is formed of a resistor, which is provided at a positive electrode side of the battery cell in the first wiring, and a capacitor, which is connected between the first wiring and the second wiring. The voltage monitoring device includes a voltage detector connected between the first wiring and the second wiring for monitoring a voltage of each battery cell. The discharging switch is provided in the voltage monitoring device and connected between the second wiring and a second wiring, which is connected to the negative electrode of the battery cell of the battery cell group of one stage higher.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION OF THE EMBODIMENT

First Embodiment

Figure 1:
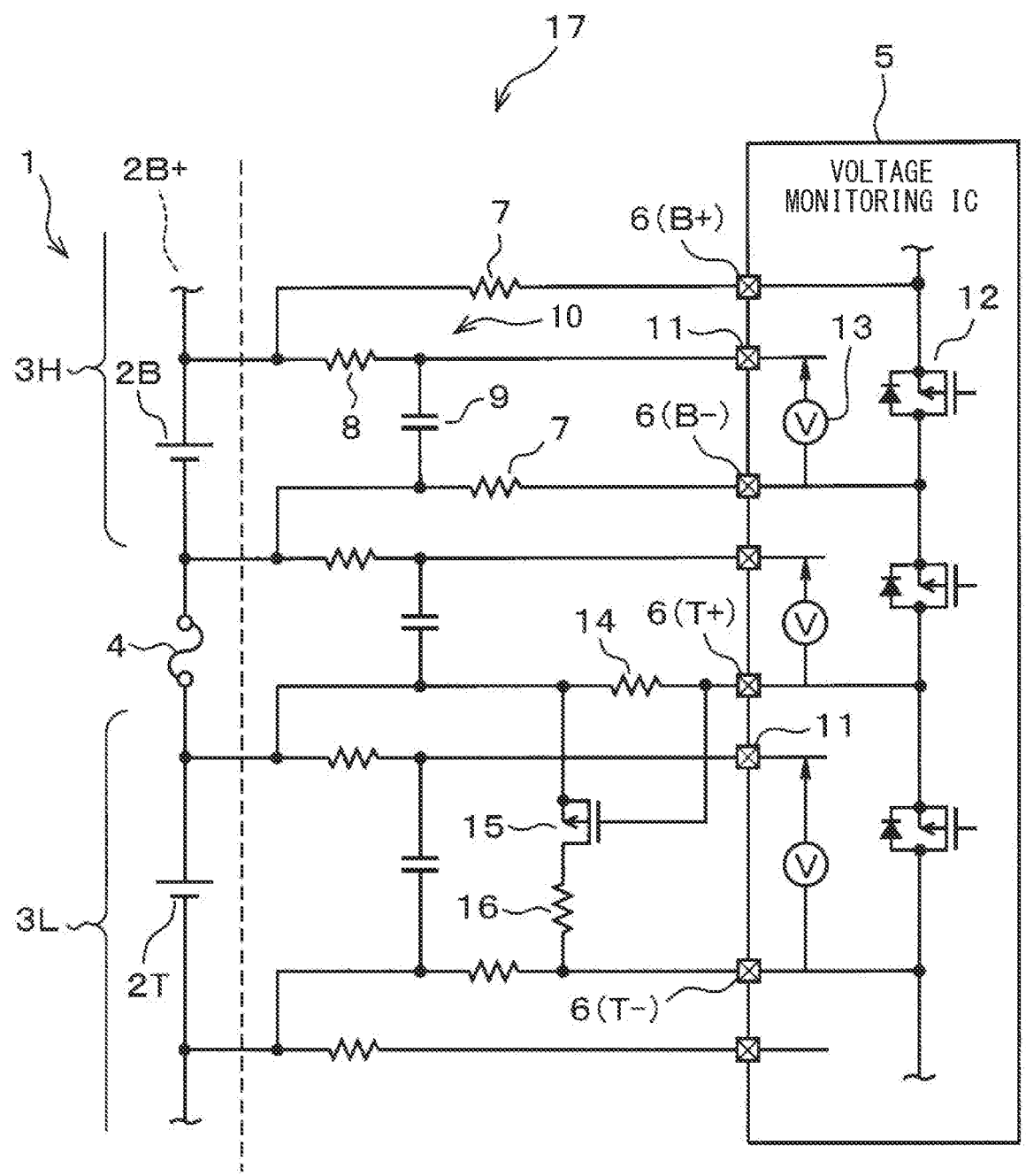
FIG. 1 is a circuit diagram showing a configuration of a battery pack monitoring system according to a first embodiment.

Referring first to FIG. 1 showing a first embodiment, a battery pack 1, which is an assembled battery, is configured by connecting multiple battery cells 2, which are secondary batteries exemplarily shown as 2B and 2T, in series in multiple stages. In the battery pack 1, a stack wire 4 connects two adjacent cell groups 3 exemplarily shown as 3H and 3L, each of which is formed by connecting a predetermined number of battery cells 2 in multiple stages in series. FIG. 1 shows a configuration, in which the stack wire 4 connects a negative electrode of a battery cell 2B, which is at the lowest voltage side in a high voltage side cell group 3H, and a positive electrode of a battery cell 2T, which is at the highest voltage side in a low voltage side cell group 3L. The stack wire 4 is an inter-group wiring provided to connect adjacent cell groups. Here, the high voltage side and the low voltage side means a high potential side and a low potential side, respectively.

A voltage monitoring integrated circuit (IC) 5 has a battery connection terminal 6 corresponding to the negative electrode of each battery cell 2, and the battery connection terminal 6 is connected to the negative electrode of the corresponding battery cell 2 via a discharging resistor 7. The voltage monitoring IC 5 operates as a voltage monitoring device.

It is noted that, for example, a positive electrode of the battery cell 2B is common to a battery cell 2B+ of high voltage side, that is, the negative electrode of battery cell 2B+, which is adjacent at the high voltage side of the battery cell 2B+. In the following description, a terminal connected to a positive electrode side of the battery cell 2 is referred to as a positive side terminal 6(+) and a terminal connected to a negative electrode side of the battery cell 2 is referred to as a negative side terminal 6(−) regardless of the position of the battery cell 2.

A series circuit of a resistor 8 and a capacitor 9 is connected to the positive electrode and the negative electrode of each battery cell 2. This series circuit forms an RC filter 10. In the voltage monitoring IC 5, a filter connection terminal 11 is provided between the connection terminals 6, which correspond to each battery cell 2. An output terminal of the RC filter 10, which is a common connection point of the resistor 8 and the capacitor 9, is connected to the filter connection terminal 11. Here, an electric connection between the positive electrode of the battery cell 2 and the filter connection terminal 11 is referred to as a first wiring, and an electric connection between the negative electrode of the battery cell 2 and the battery connection terminal 6 is referred to as a second wiring.

A discharging switch 12 formed of a P-channel MOSFET is provided inside the voltage monitoring IC 5 and connected between the battery connection terminals 6 in correspondence to each battery cell 2. The voltage monitoring IC 5 includes a voltage detector 13 in correspondence to each battery cell 2. The voltage detector 13 is connected between the filter connection terminal 11 and the battery connection terminal 6. The discharging switch 12 is controlled to turn on and off by a control circuit (not shown) thereby to equalize the voltage of each battery cell 2. A terminal voltage of the battery cell 2 applied through the RC filter 10 and detected by the voltage detector 13 is A/D converted and read into the control circuit.

It is noted that the number of stages of the cell groups 3 of the battery pack 1 varies from manufacturer to manufacturer, for example. Therefore, when the voltage monitoring IC 5 is connected to the battery pack 1, some terminals of the voltage monitoring IC 5, some voltage detectors 13, are connected to the stack wires 4 and not connected to the battery cells 2 as exemplified in FIG. 1. The terminals of the voltage monitoring IC 5 connected to the positive electrode side and the negative electrode side of the battery cell 2T are referred to as 6(T+) and 6(T−), respectively. In the present embodiment, a current limiting resistor 14 is provided at a position where the stack wire 4 is connected, in place of the discharging resistor 7 provided between the positive electrode of the battery cell 2T and the terminal 6(T+). A resistance value of the current limiting resistor 14 is set higher than a resistance value of the discharging resistor 7. For example, if the latter is about several hundred ohms (Ω), the former is set to about several kilo ohms (kΩ) to several tens kilo ohms (kΩ). That is, the current limiting resistor 14 has the resistance value higher than that of the discharging resistor 7 by about ten to one hundred times, for example.

Figure 3:
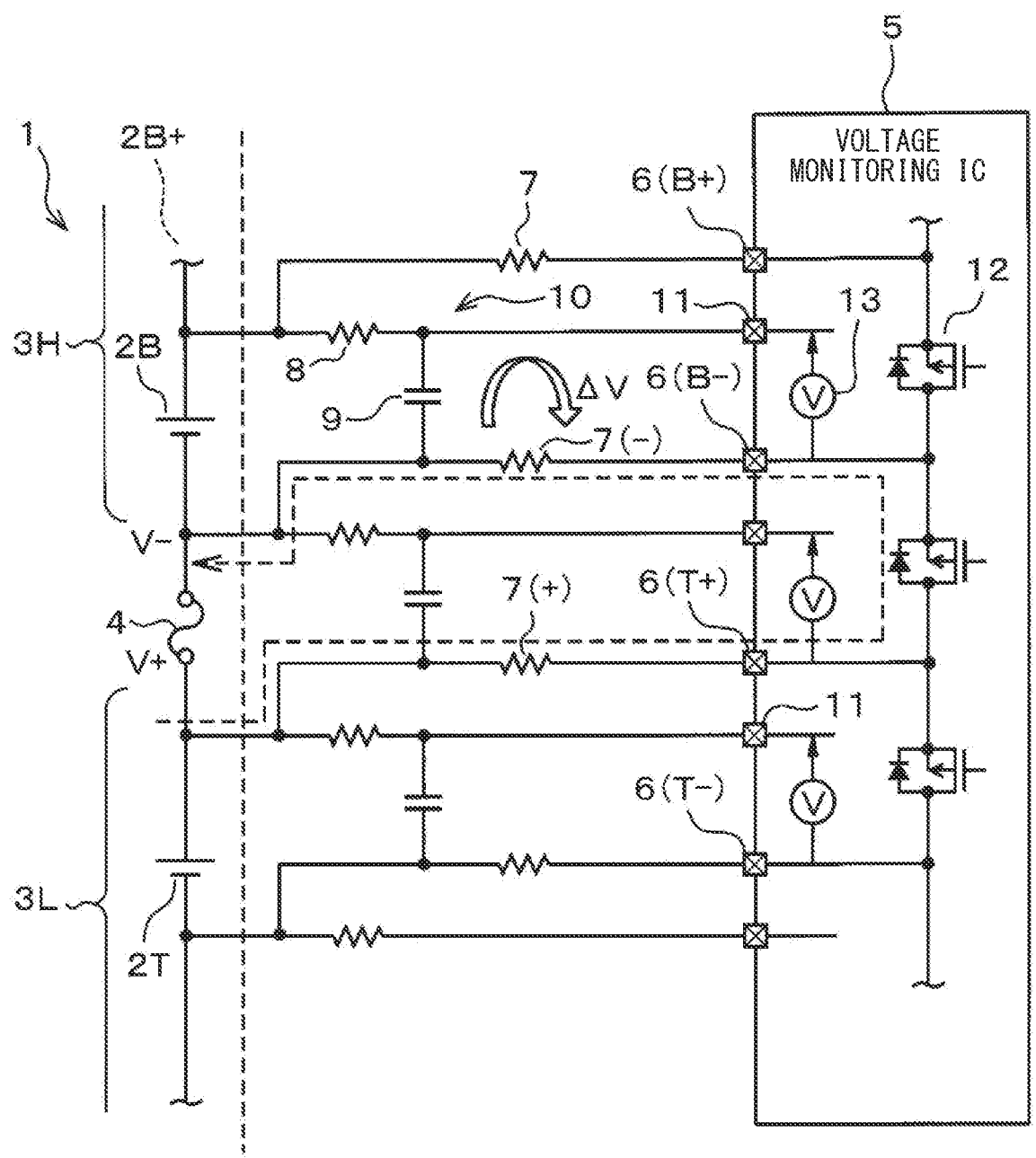
FIG. 3 is a circuit diagram illustrating a configuration of a conventional battery pack monitoring system.

The conventional configuration shown in FIG. 3 (JP 2017-125756A) is the same as that disclosed in FIG. 1 except for the stack wire 4. It is assumed in this configuration that a negative electrode voltage V− of the battery cell 2B of the higher voltage side cell group 3H falls to be lower than a positive electrode voltage V+ of the battery cell 2T of the lower voltage side cell group 3L because of a charging and discharging current. In this case, as shown by a dotted line arrow in FIG. 3, the current flows in the following route: from the positive electrode side of the battery cell 2T to the negative electrode side of the battery cell 2B through the discharging resistor 7(+), battery connection terminal 6(+), parasitic diode of the discharging switch 12, battery connection terminal 6(B−) and discharging resistor 7(−) in sequence. As a result, a voltage drop ΔV arises in the discharging resistor 7(−). When the voltage monitoring IC 5 measures the terminal voltage of the battery cell 2B in this state, the voltage drop ΔV causes an error in a measured voltage.

Therefore, in the present embodiment shown in FIG. 1, in order to prevent the occurrence of the above measurement error, the discharging resistor 7 is replaced with the current limiting resistor 14 as shown in FIG. 1. By positioning the current limiting resistor 14 having a high resistance value in the above current flow path, the voltage measurement error due to the reverse flow of current is reduced.

However, the current limiting resistor 14 causes another problem. The present embodiment is therefore provided with a P-channel MOSFET 15 and a resistor 16 additionally as described below. A gate of the P-channel MOSFET 15 is connected to the terminal 6(T+), and a source of the FET 15 is connected to the positive electrode of the battery cell 2T. A drain of the FET 15 is connected to the terminal 6(T−) via the resistor 16. A gate of a MOSFET is a control terminal for turning on and off the MOSFET like a base of a transistor is for turning on and off the transistor. A resistance value of the resistor 16 is set to the same value as the resistor 7. A battery pack monitoring system 17 is configured as described above.

Figure 2:
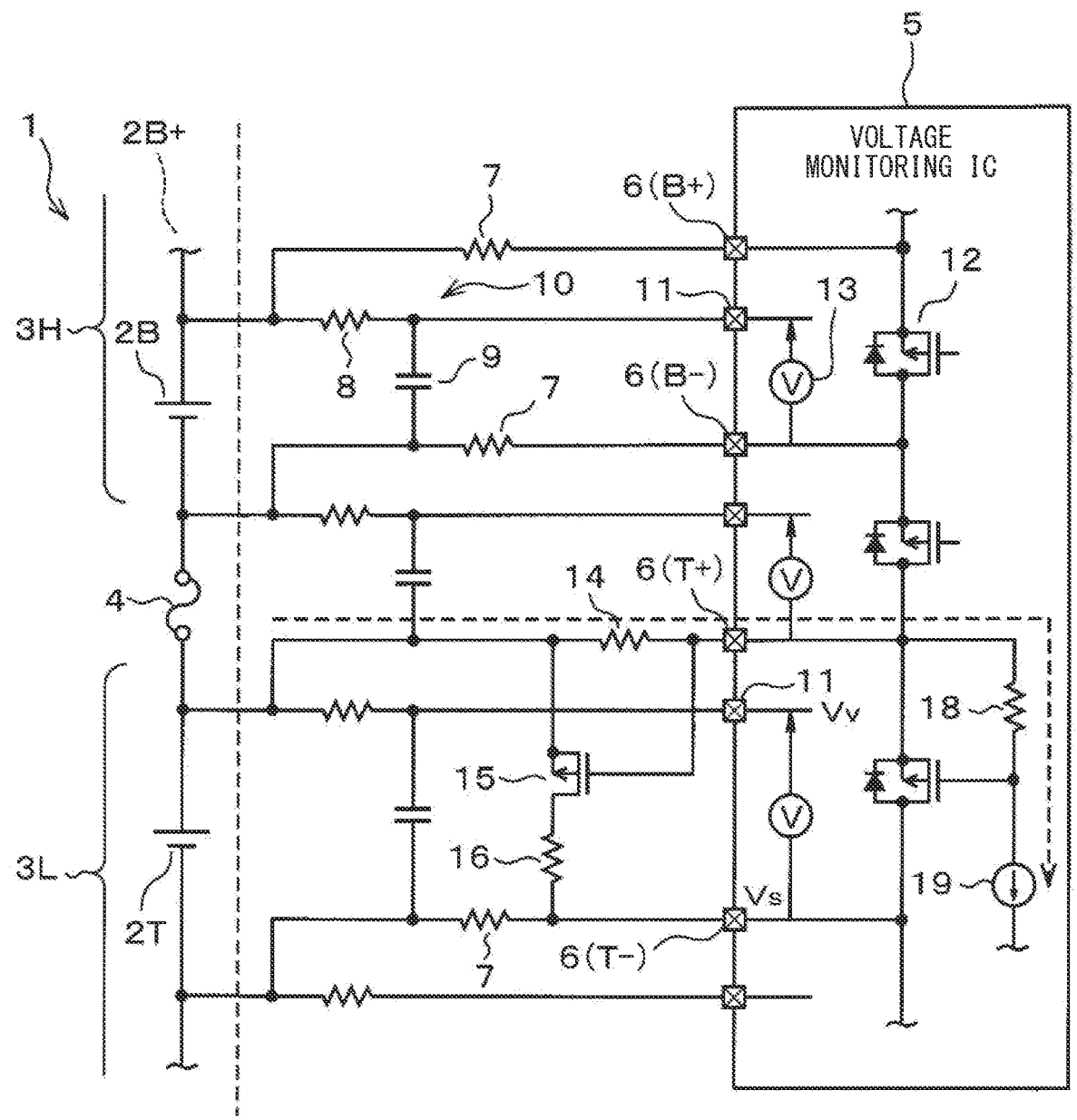
FIG. 2 is a circuit diagram showing a circuit for driving a discharging switch inside a battery monitoring IC.

Next, operation of the present embodiment will be described. FIG. 2 shows a drive circuit for turning on the discharging switch 12, which is provided inside the voltage monitoring IC 5. A resistor 18 is connected between a source and a gate of the discharging switch 12, and a current source 19 is connected to the gate. The voltage monitoring IC 5 operates the current source 19 to draw a current, thereby causing the resistor 18 to generate a voltage difference between the source and the gate, turning on the discharging switch 12, and discharging the battery cell 2 for equalization processing.

However, since the current limiting resistor 14 having the resistance value higher than that of the discharging resistor 7 is provided in the discharge path of the battery cell 2T, a large voltage drop arises in the resistor 14 when the voltage monitoring IC 5 operates the current source 19 to turn on the corresponding discharging switch 12. Then, a voltage between the drain and the source of the FET decreases, and the discharging switch 12 may not be turned on.

Therefore, in the present embodiment, the FET 15 is connected to the outside of the voltage monitoring IC 5 as a substitute electric switch. As a result, when the voltage monitoring IC 5 operates the current source 19 as described above, a sufficient voltage difference occurs between the source and gate of the FET 15 due to the voltage drop generated by the resistor 14, and the FET 15 is turned on. Thus, a current flows from the positive electrode of the battery cell 2T to the negative electrode of the battery cell 2T through the FET 15, resistor 16 and resistor 7 in sequence. Thus, the voltage of the battery cell 2T is also equalized as the other battery cells 2.

As described above, according to the present embodiment, the battery pack 1 having the stack wire 4, which connects two adjacent cell groups, that is, the cell group 3H of the high voltage side and the cell group 3L of the low voltage side, is a subject to be monitored. The RC filter 10 is formed of the resistor 8, which has one end connected to the positive electrode side of the battery cell 2, and the capacitor 9, which is connected to the other end of the resistor 8 and the negative electrode side of the same battery cell 2. The voltage monitoring IC 5 is connected to monitor the voltage of each battery cell 2 by the voltage detector 13. Inside the voltage monitoring IC 5, the discharging switch 12 is provided and connected between the second wiring of one battery cell and the second wiring of the other battery cell 2, which is provided adjacent to and at the higher voltage side of the one battery cell, that is, provided one stage higher in voltage. Both ends of the stack wire 4 are connected to the voltage monitoring IC 5 in a similar way as both electrodes of the battery cell 2 are to the voltage monitoring IC 5.

The discharging resistor 7 is provided at a position, where the capacitor 9 forming the RC filter 10 does not discharge its charged electricity in the first wiring. In the second wiring of the stack wire 4, the current limiting resistor 14, which has the resistance value higher than that of the discharging resistor 7, is provided. The series circuit of the FET 15, which is a substitute discharging switch, and the discharging resistor 16 is connected between the second wiring and the battery connection terminal 6(T−) of the voltage monitoring IC 5. The FET 15 is turned on by the voltage drop generated when the current flows in the current limiting resistor 14.

According to the above configuration, even when the negative electrode voltage of the battery cell 2B, which is at one end of the stack wire 4, falls because of noise and the like in case of using the MOSFET as the discharging switch 12, the current limiting resistor 14 provided in the current flow path, in which the current flows in reverse through the parasitic diode of the MOSFET, decreases the error in the measurement of the battery cell voltage caused by the reverse current flow. For this reason, even in case that it is not known in advance at which position the stack wire 4 will be connected, it is possible to replace the discharging resistor 7 with the current limiting resistor 14 at the position outside the voltage monitoring IC 5.

Further, the source and gate of the FET 15 are connected to both ends of the current limiting resistor 14, respectively, so that the FET 15 is turned on by the voltage drop generated when the current flows in the current limiting resistor 14. As a result, even in case that the discharging switch 12 is not turned on because of the current limiting resistor 14 provided in place of the discharging resistor 7, the battery cell 2T is discharged through the path including two current discharging resistors 16 and 7 in the similar way as in the other battery cells 2 so that the equalization processing is performed.

Second to Fourth Embodiments

Second to fourth embodiments are modifications of the first embodiment. Hereinafter, the identical configuration as those in the first embodiment will be designated by the same reference numerals for simplification of description. Only differences from the first embodiment will be described.

Figure 4:
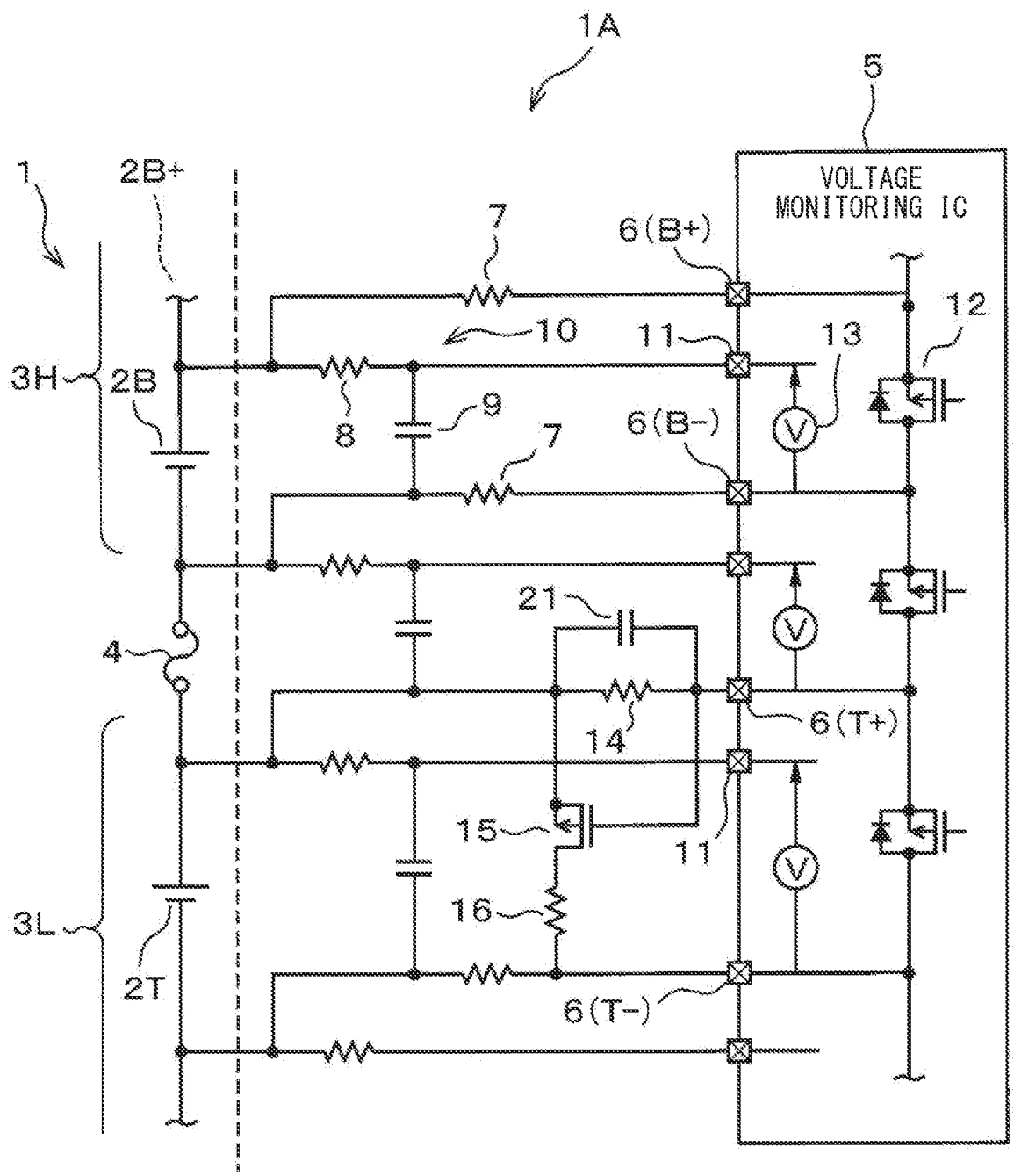
FIG. 4 is a circuit diagram showing a configuration of a battery pack monitoring system according to a second embodiment.

In a battery monitoring system 1A of the second embodiment shown in FIG. 4, a filter is formed by connecting a capacitor 21 in parallel with the current limiting resistor 14. This filter prevents the FET 15 from malfunctioning due to the influence of noise.

Figure 5:
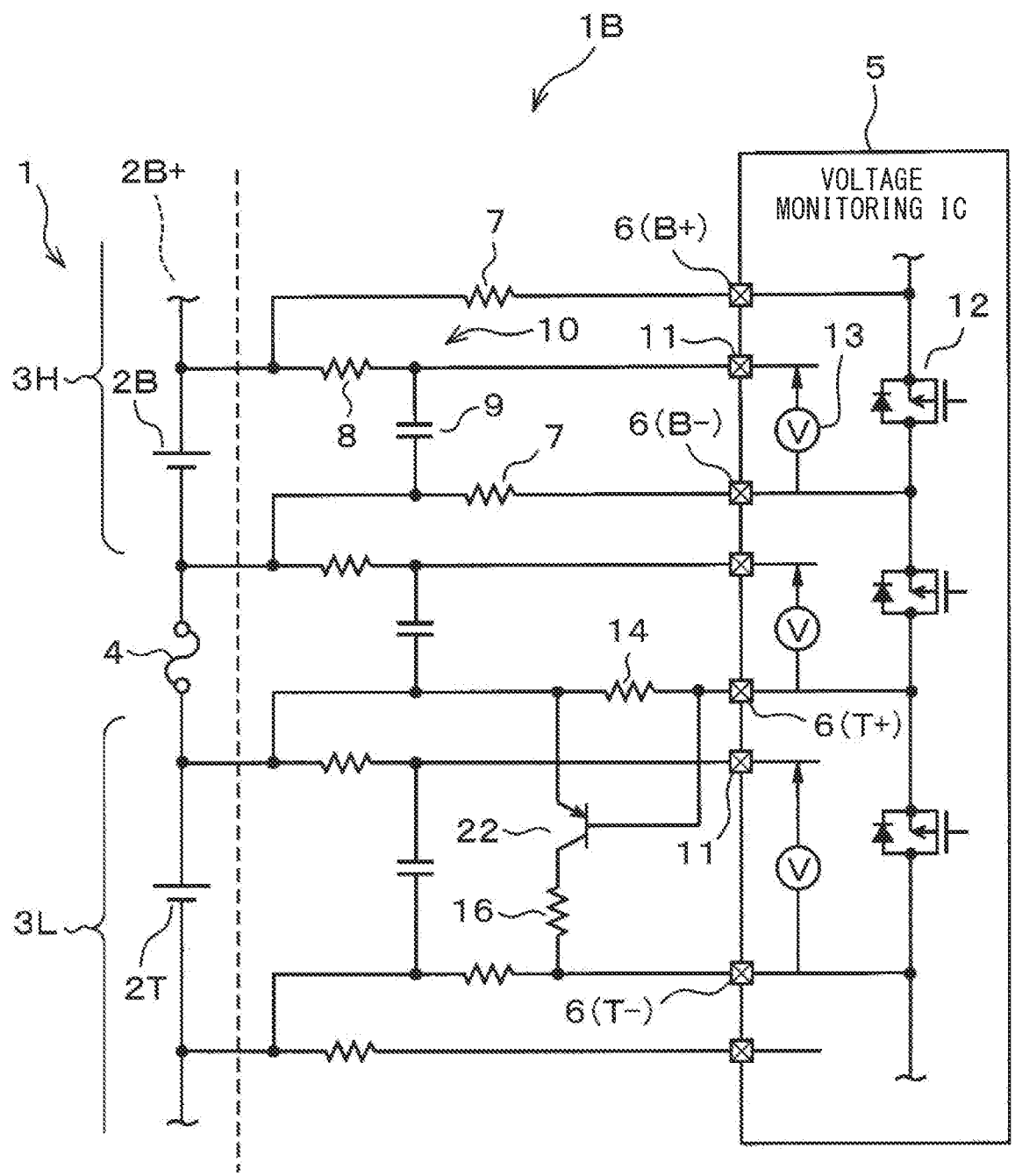
FIG. 5 is a circuit diagram showing a configuration of a battery pack monitoring system according to a third embodiment.

In a battery monitoring system 1B of the third embodiment shown in FIG. 5, a PNP transistor 22 is provided in place of the FET 15 provided in the first and second embodiments.

Figure 6:
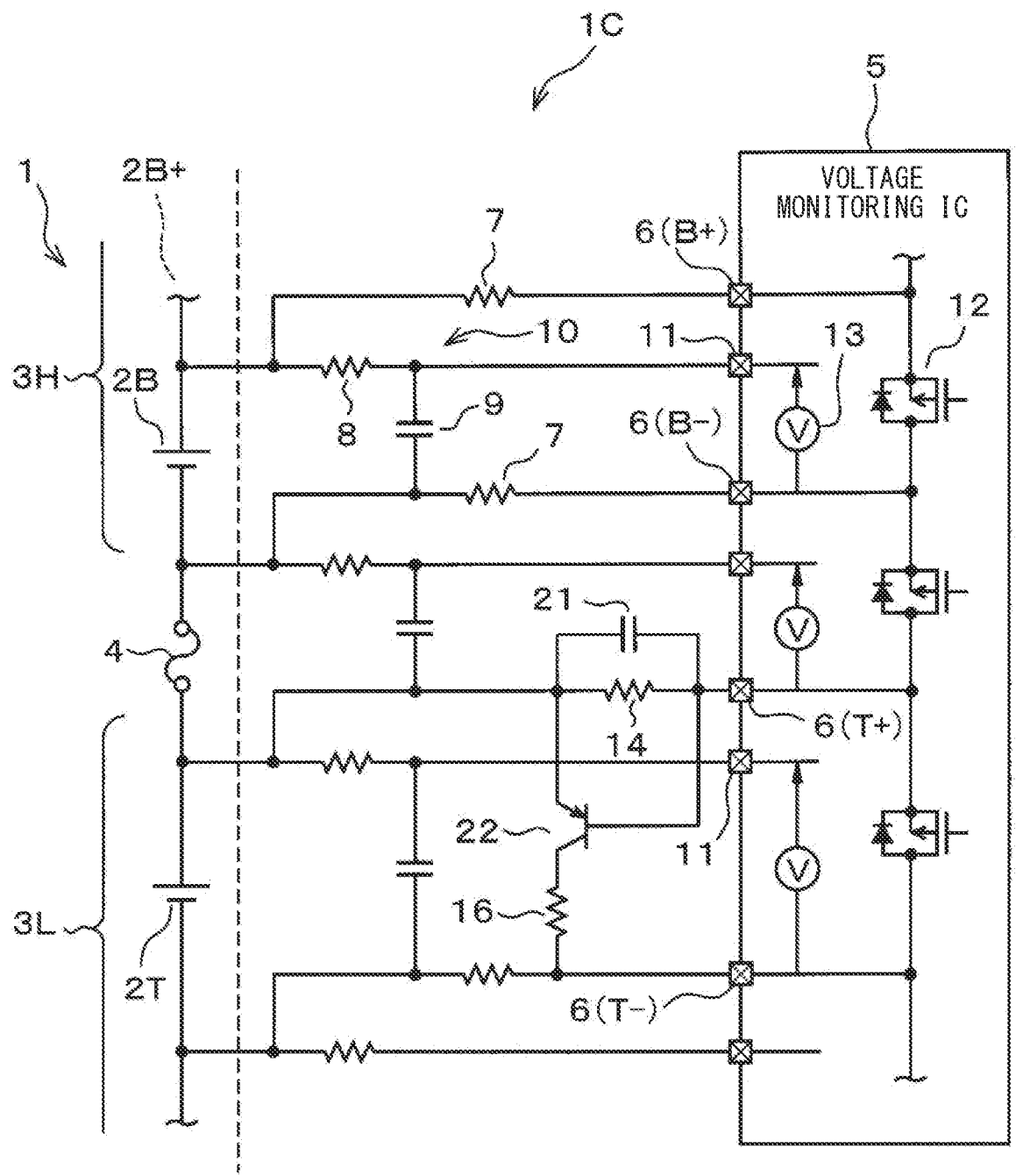
FIG. 6 is a circuit diagram showing a configuration of a battery pack monitoring system according to a fourth embodiment.

In a battery monitoring system 1C of the fourth embodiment shown in FIG. 6, the capacitor 21 is connected to the configuration of the third embodiment, as in the second embodiment.

Fifth Embodiment

Figure 7:
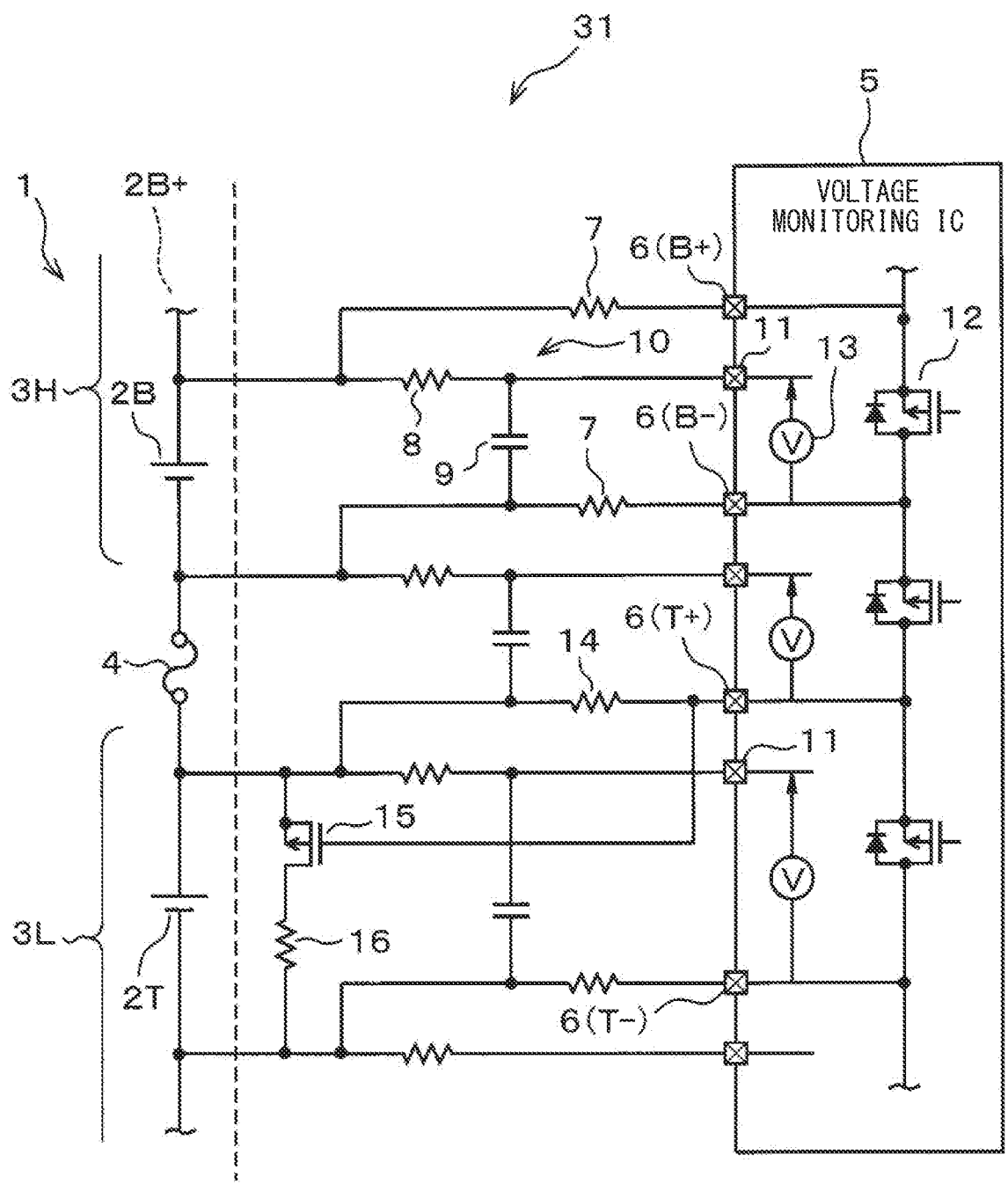
FIG. 7 is a circuit diagram showing a configuration of a battery pack monitoring system according to a fifth embodiment.

In a fifth embodiment shown in FIG. 7, a battery monitoring system 31 is different from the first embodiment in the connection position of the series circuit of the FET 15 and the resistor 16. The series circuit is connected in parallel with the battery cell 2T. According to this configuration, the resistor 7 is not included in the flow path of the current which flows when the FET 15 is turned on. Therefore, a drain-source voltage of the FET 15 becomes higher, and the FET 15 can be turned on more reliably.

Sixth Embodiment

Figure 8:
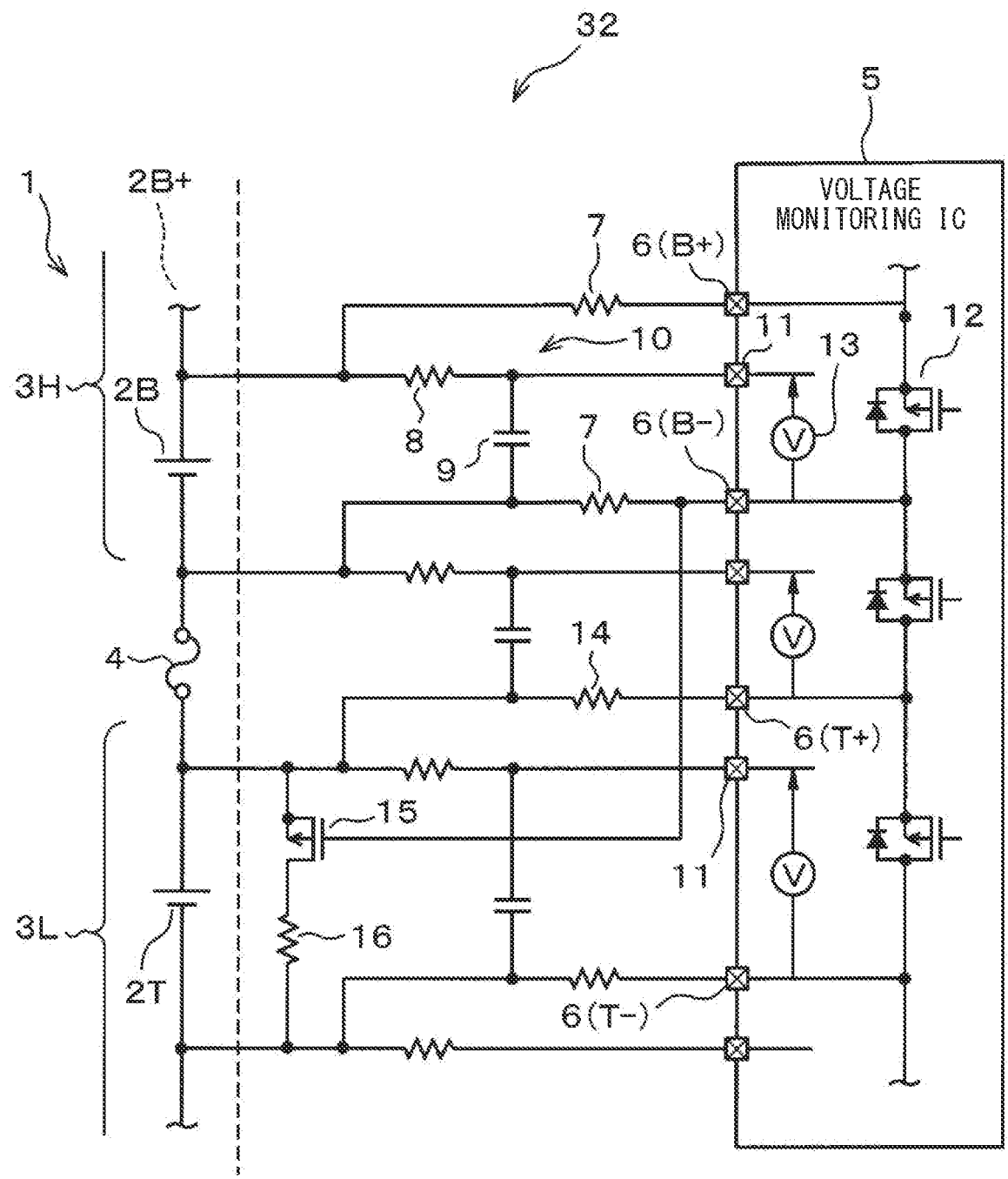
FIG. 8 is a circuit diagram showing a configuration of a battery pack monitoring system according to a sixth embodiment.

In a battery monitoring system 32 of a sixth embodiment shown in FIG. 8, the connection position of the gate of the FET 15 in the configuration of the fifth embodiment is changed. Specifically, the gate of the FET 15 is connected to the battery connection terminal 6(B−) of the battery monitoring IC 5 which is connected to the negative electrode side of the battery cell 2B. According to this configuration, when the discharging switch 12, which corresponds to the position of the stack wire 4, is turned on, the voltage drop generated in the resistor 7 applies a voltage difference between the source and the gate of the FET 15 to turn on the FET 15.

Seventh Embodiment

Figure 9:
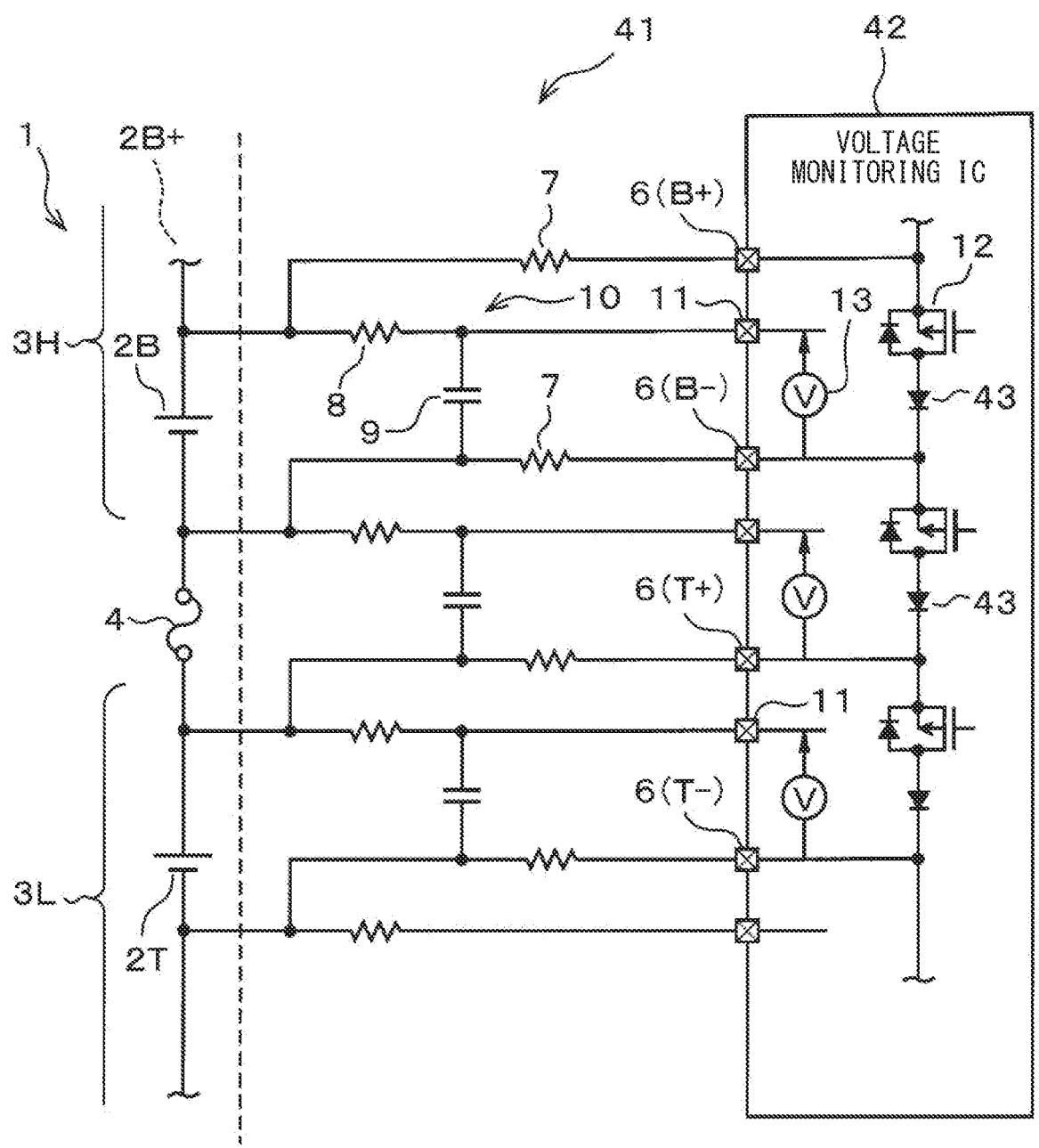
FIG. 9 is a circuit diagram showing a configuration of a battery pack monitoring system according to a seventh embodiment.

In a battery monitoring system 41 of a seventh embodiment shown in FIG. 9, a battery monitoring IC 42 is configured differently from the above-described embodiments in that the battery monitoring system IC 42 includes therein a reverse flow preventing configuration. Therefore, the discharging resistor 7 is arranged in place of the current limiting resistor 14, and the series circuit of the FET 15 and the resistor 16 is not provided. Inside the battery monitoring IC 42, a diode 43 is connected to the drain of the discharging switch 12 thereby to prevent the current from flowing in reverse. The diode 43 is connected in reverse to the parasitic diode of the discharging switch 12 so that the reverse flow of current is prevented.

Eighth Embodiment

Figure 10:
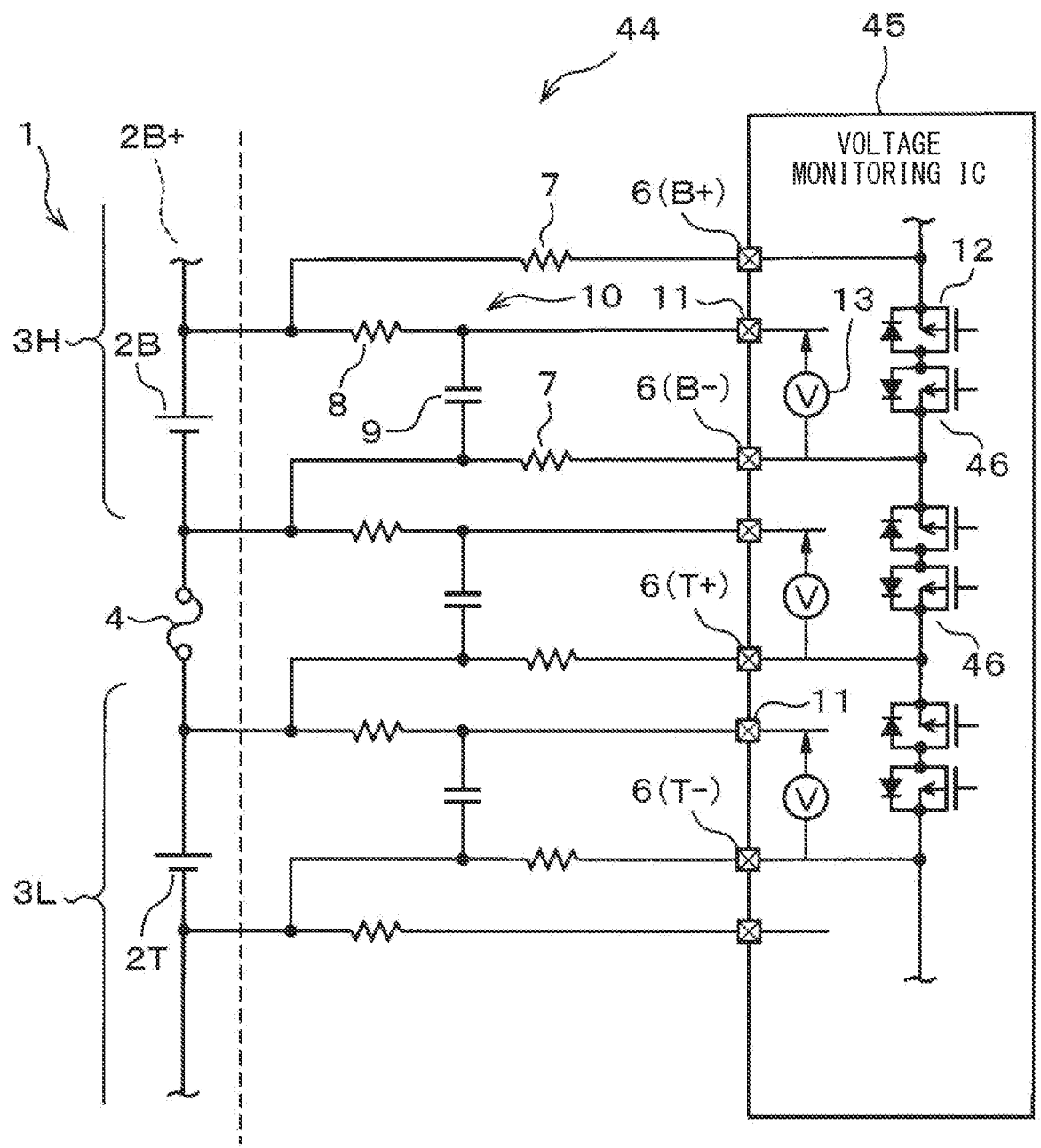
FIG. 10 is a circuit diagram showing a configuration of a battery pack monitoring system according to an eighth embodiment.

A battery monitoring system 44 of the eighth embodiment shown in FIG. 10 is a modification of the seventh embodiment and is provided with a battery monitoring IC 45 in place of the battery monitoring IC 42. In the battery monitoring IC 45, instead of the diode 43, a P-channel MOSFET 46 is connected in the opposite direction in polarity to the parasitic diode of the discharging switch 12.

Ninth Embodiment

Figure 11:
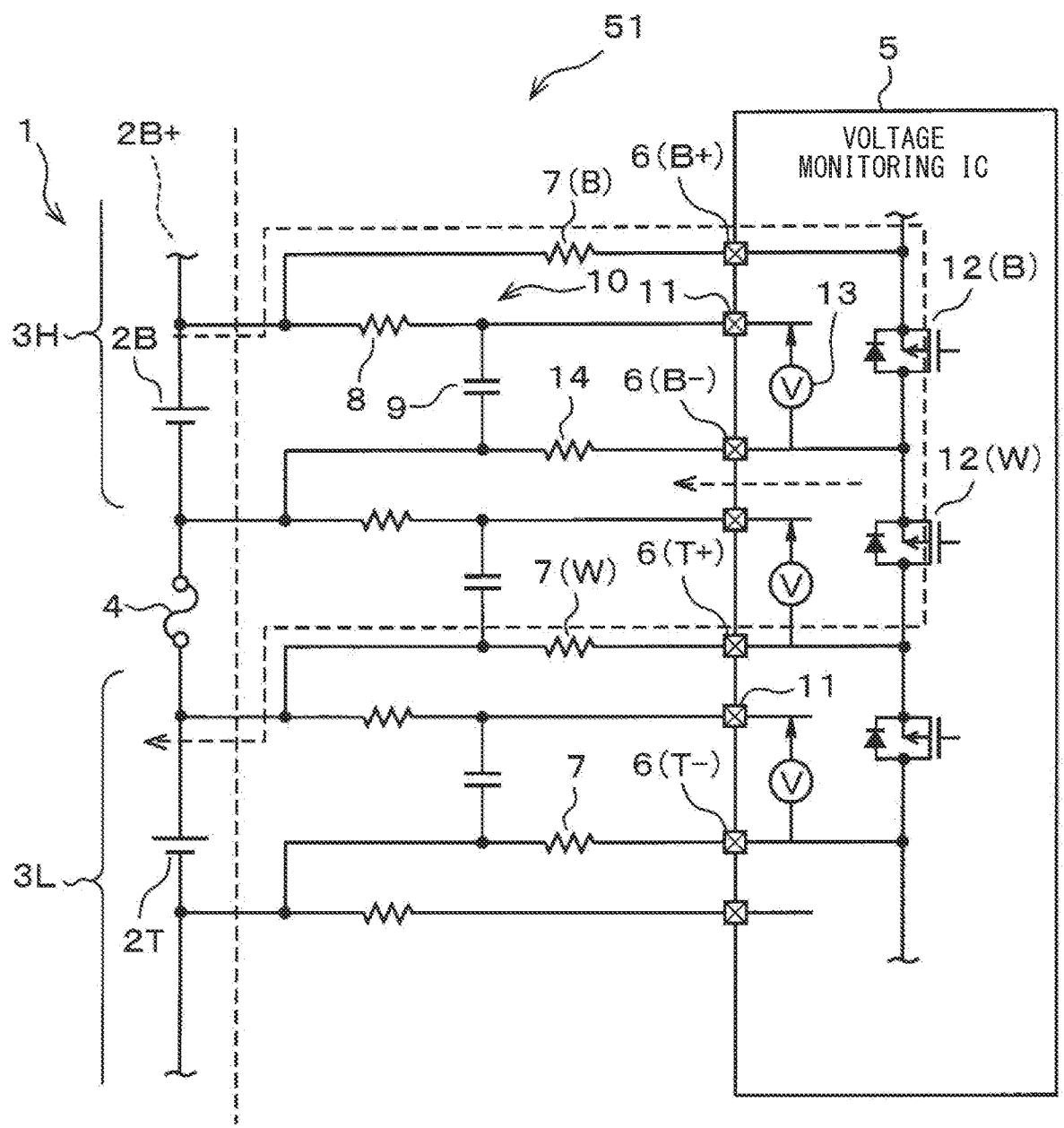
FIG. 11 is a circuit diagram showing a configuration of a battery pack monitoring system according to a ninth embodiment.

A battery monitoring system 51 of a ninth embodiment shown in FIG. 11 has a configuration in which the series circuit of the FET 15 and the resistor 16 of the first embodiment is not provided. Further, the current limiting resistor 14 is provided in place of the discharging resistor 7 provided for the battery cell 2B which is one stage higher, that is, higher voltage side relative to the stack wire 4. With this configuration, the current limiting resistor 14 reduces the reverse current flow when the negative electrode voltage V− of the battery cell 2B becomes lower than the positive electrode voltage V+ of the battery cell 2T.

In the equalization processing for the battery cell 2B, the discharging switches 12 corresponding to the battery cell 2B and the stack wire 4 are turned on at the same time. Circuit elements corresponding to the stack wire 4 are designated with a reference sign (W) to each reference numeral. As a result, the current flows from the positive electrode of the battery cell 2B to the negative electrode of the battery cell 2B through the resistor 7(B), discharging switch 12(B), discharging switch 12(W) and resistor 7(W), thereby performing the equalization processing for the battery cell 2B.

Other Embodiments

The above embodiments may be modified as follows, for example. The discharging switch may be formed of an N-channel MOSFET or a bipolar transistor. The drive circuit for the discharging switch may be configured differently from the configuration shown in FIG. 2. Constants of circuit elements may be varied in correspondence to each device configuration.

Although the present disclosure has been made in accordance with the embodiments, it is understood that the present disclosure is not limited to such embodiments and configurations. The present disclosure covers various modification examples and equivalent arrangements. In addition, various combinations and forms, and further, other combinations and forms including only one element, or more or less than these elements are also within the sprit and the scope of the present disclosure.

What is claimed is:

1. A battery pack monitoring system for monitoring a battery pack including multiple cell groups, each of which is formed of multiple battery cells connected in series in multiple stages, and an inter-group wiring connecting a high voltage side cell group and a low voltage side cell group in the multiple cell groups, the battery pack monitoring system comprising:
   a first wiring connected to a positive electrode of each battery cell;
   a second wiring connected to a negative electrode of each battery cell;
   an RC filter formed of a resistor, which is provided at the positive side of the battery cell in the first wiring, and a capacitor, which is connected between the first wiring and the second wiring; and
   a voltage monitoring device including a voltage detector connected between the first wiring and the second wiring for monitoring a voltage of each battery cell, wherein:
   the voltage monitoring device includes therein a discharging switch connected between two second wirings connected to the negative electrodes of the battery cells connected in series and adjacent to each other;
   the first wiring, the second wiring and the discharging switch are connected also to both ends of the inter-group wiring;
   the second wiring connected to each battery cell is provided with a discharging resistor at a position where a charged electricity of the capacitor forming the RC filter is not discharged;
   the second wiring connected to a lower potential side of the inter-group wiring is provided with a current limiting resistor, which has a resistance value higher than that of the discharging resistor;
   a series circuit of a substitute discharging switch and a discharging resistor is provided between two second wirings connected to the positive electrode and the negative electrode of the battery cell which is connected to the inter-group wiring; and
   the substitute discharging switch is turned on by a voltage drop generated when a current flows in the current limiting resistor.

2. The battery pack monitoring system according to claim 1, wherein:
   the substitute discharging switch is formed of a transistor; and
   a control terminal of the transistor is connected to a voltage monitoring device side of the current limiting resistor.

3. The battery pack monitoring system according to claim 1, wherein:
   the series circuit is connected in parallel with the battery cell of a highest potential stage in the battery cell group connected to the inter-group wiring.

4. The battery pack monitoring system according to claim 3, further comprising:
   a capacitor connected in parallel with the current limiting resistor.

5. The battery pack monitoring system according to claim 1, wherein:
   the substitute discharging switch is formed of a transistor; and
   a control terminal of the transistor is connected to a voltage monitoring device side of the discharging resistor provided in the second wiring of the battery cell to which the inter-group wiring is connected.

6. The battery pack monitoring system according to claim 2, wherein:
   the series circuit is connected in parallel to the battery cell of a highest potential stage in the battery cell group connected to the inter-group wiring.

7. The battery pack monitoring system according to claim 2, wherein:
   the substitute discharging switch is formed of a transistor; and
   a control terminal of the transistor is connected to a voltage monitoring device side of the discharging resistor provided in the second wiring of the battery cell to which the inter-group wiring is connected.

8. A battery pack monitoring system for monitoring a battery pack including multiple cell groups, each of which is formed of multiple battery cells connected in series in multiple stages, and an inter-group wiring connecting a high voltage side cell group and a low voltage side cell group connected in series and adjacent to each other in the multiple cell groups, the battery pack monitoring system comprising:
- a first wiring connected to a positive electrode of each battery cell;
- a second wiring connected to a negative electrode of each battery cell;
- an RC filter formed of a resistor and a capacitor, the resistor being provided at a positive electrode side of the battery cell in the first wiring, and the capacitor being connected between the first wiring and the second wiring; and
- a voltage monitoring device including a voltage detector connected between the first wiring and the second wiring for monitoring a voltage of each battery cell, wherein:
- the voltage monitoring device includes therein a series circuit of a discharging switch and a reverse flow preventing element, the series circuit being provided between two second wirings connected to the negative electrodes of the battery cells connected in series and adjacent to each other;
- the first wiring, the second wiring and the discharging switch of the series circuit are connected also to both ends of the inter-group wiring; and
- the second wiring connected to each battery cell is provided with a discharging resistor at a position where a charged electricity of the capacitor forming the RC filter is not discharged.

9. A battery pack monitoring system for monitoring a battery pack including multiple cell groups, each of which is formed of multiple battery cells connected in series in multiple stages, and an inter-group wiring connecting a high voltage side cell group and a low voltage side cell group connected in series and adjacent to each other in the multiple cell groups, the battery pack monitoring system comprising:
- a first wiring connected to a positive electrode of each battery cell;
- a second wiring connected to a negative electrode of each battery cell;
- an RC filter formed of a resistor and a capacitor, the resistor being provided at a positive electrode side of the battery cell in the first wiring, and the capacitor being connected between the first wiring and the second wiring; and
- a voltage monitoring device including a voltage detector connected between the first wiring and the second wiring for monitoring a voltage of each battery cell, wherein:
- the voltage monitoring device includes therein a discharging switch connected between two second wirings connected to the negative electrodes of the battery cells connected in series and adjacent to each other;
- the first wiring, the second wiring and the discharging switch are connected also to both ends of the inter-group wiring;
- the second wiring connected to each battery cell is provided with a discharging resistor at a position where a charged electricity of the capacitor forming the RC filter is not discharged; and
- the discharging resistor provided in the second wiring connected to a high potential side of the inter-group wiring has a resistance value higher than that of other discharging resistors in the second wiring.

* * * * *